United States Patent
Tanizaki et al.

[11] Patent Number: 5,909,046
[45] Date of Patent: Jun. 1, 1999

[54] SEMICONDUCTOR INTEGRATED CIRCUIT DEVICE HAVING STABLE INPUT PROTECTION CIRCUIT

[75] Inventors: Tetsushi Tanizaki; Fukashi Morishita; Masaki Tsukude; Kazutami Arimoto, all of Hyogo, Japan

[73] Assignee: Mitsubishi Denki Kabushiki Kaisha, Tokyo, Japan

[21] Appl. No.: 08/965,618

[22] Filed: Nov. 6, 1997

[30] Foreign Application Priority Data

Mar. 26, 1997 [JP] Japan .................................. 9-073661

[51] Int. Cl.$^6$ ........................................................ H01L 23/62
[52] U.S. Cl. ............................................ 257/358; 257/363
[58] Field of Search ................................... 257/363, 358, 257/359, 360

[56] References Cited

U.S. PATENT DOCUMENTS 4,757,363  7/1988  Bohm et al. .............................. 257/358
5,223,737  6/1993  Canclini .................................. 257/363
5,637,900  6/1997  Ker et al. ................................ 257/358

FOREIGN PATENT DOCUMENTS 64-9649  1/1989  Japan .

*Primary Examiner*—David B. Hardy
*Attorney, Agent, or Firm*—McDermott, Will & Emery

[57] ABSTRACT

A conductor line is placed at a layer overlying an input protection circuit electrically coupled to a pad such that the conductor line covers at least a part of the input protection circuit. The conductor line having a sufficiently large width disperses and absorbs the heat generated from the input protection circuit. Since the input protection circuit and the conductor line have a region overlapping with each other in the layout of plan view, an area for layout of the input protection circuit on a chip can be reduced effectively, and prevention of a destruction of the protection circuit due to the heat as well as an improvement of a resistance to the surge can be obtained.

20 Claims, 9 Drawing Sheets

SEMICONDUCTOR INTEGRATED CIRCUIT DEVICE HAVING STABLE INPUT PROTECTION CIRCUIT

BACKGROUND OF THE INVENTION

1. Field of the Invention

The present invention generally relates to a semiconductor integrated circuit device and particularly to a protection circuit for protecting an internal circuit against an external surge voltage The invention more particularly relates to a layout of an input protection circuit for reducing the chip area and enhancing the resistance to the surge

2. Description of the Background Art

In a semiconductor integrated circuit device (MOS integrated circuit device) having an MOS transistor (insulated gate type field effect transistor) as a component thereof, a gate insulating film of an input transistor receiving an external signal is made relatively thin for implementing its high speed operation (for decreasing an absolute value of the threshold voltage). In the MOS transistor having such a thin gate insulating film, the gate insulating film is broken by discharge of the static electricity For example, since the breakdown voltage of a silicon oxide film is approximately $7 \cdot 10^6$ V/cm, a gate oxide film (silicon oxide film) having its film thickness of 10 nm suffers the dielectric breakdown when a voltage of 7V is applied thereto. The source of such a high input voltage is the human body, package insertion device, test device, running system operation, lightning, and the like. If the source is the static electricity generated from the human body, for example, the peak value of the current may reach several amperes The input protection circuit is provided in order to prevent transmission of a transient high voltage (surge voltage) due to such static electricity to an internal circuit.

FIG. 14 shows one example of a structure of a conventional input protection circuit. Referring to FIG. 14, an input protection circuit IPC includes: a resistance element R1 connected between a pad PD and a node NA; a resistance element R2 connected between node NA and a node NB; a field transistor FT connected between node NA and a ground node GND and having its gate connected to ground node GND and having a field insulating film as the gate insulation film; and an n channel MOS transistor IF connected between node NB and a ground node GND and having its gate connected to ground node GND. The gate insulating film of MOS transistor IF is similar to that of an ordinary MOS transistor. Pad PD is connected to a frame lead FL constituting an external terminal via a bonding wire BW.

An internal circuit INC which operates responsive to a signal potential applied onto node NB includes at the first input stage, for example, a CMOS inverter constituted by a p channel MOS transistor PQ and an n channel MOS transistor NQ. The source of p channel MOS transistor PQ is connected to a power supply node VCC, and the source of n channel MOS transistor NQ is connected to a ground node GND.

Resistance element R1 limits a surge current flowing into input protection circuit IPC. Field transistor FT is turned on when a voltage level on node NA attains to at least a prescribed voltage because of the avalanche breakdown or the punch-through so that it discharges the surge voltage transmitted to node NA to ground node GND at a high speed.

Resistance element R2 has its resistance value made larger than that of resistance element R1 Resistance element R2 has a function of preventing transmission of the surge voltage on node NA to node NB during discharging of the surge voltage by field transistor FT.

MOS transistor IF has two functions. One is to absorb a small abnormal negative surge voltage transmitted to node NB by turning on to transmit a ground voltage GND on ground node GND (the node and the voltage on the node are represented by the same reference characters) to node NB. The other function is to determine whether pad PD and frame lead FL are connected normally. Specifically, when a negative bias voltage is applied to frame lead FL to set node NB at the negative voltage level, MOS transistor IF is rendered conductive so that a current flows from ground node GND to frame lead FL via internal node NB and pad PD. By externally detecting the current, whether bonding wire BW is correctly connected or not can be determined. MOS transistor IF does not have a large surge voltage applied thereto and has a function of clamping a negative voltage level on node NB at a $-V_{th}$ level, where $V_{th}$ represents a threshold voltage of MOS transistor IF.

FIG. 15 schematically shows a cross sectional structure of field transistor FT shown in FIG. 14. Referring to FIG. 15, field transistor FT includes high-concentration N type impurity regions 102 and 104 formed with a space therebetween at a surface of a P type semiconductor substrate region 100, and a field insulating film (LOCOS film) 106 formed between these impurity regions 102 and 104. N type impurity regions 102 and 104 are separated from other elements by field insulating films (LOCOS films) 108a and 108b formed along their outer peripheries.

In the structure of field transistor FT shown in FIG. 15, impurity region 102 is connected to node NA, and impurity region 104 is connected to ground node GND. A gate electrode layer 107 is formed over field insulating film 106 and is electrically connected to N type impurity region 104.

When a transient high voltage surge is applied to node NA, the potential at N type impurity region 102 increases so that N type impurity region 102 and P type semiconductor substrate region 100 reach a highly reverse-biased state. Because of the high voltage applied to the N type impurity region, a depletion layer expands and a lateral parasitic bipolar transistor of an npn structure having impurity region 102, substrate region 100 and impurity region 104 respectively as collector, base and emitter is turned on through the punch-through phenomenon. Accordingly, the high voltage applied to node NA is transmitted to ground node GND via impurity region 102, substrate region 100 and impurity region 104 to be absorbed by the ground voltage supply source.

When the parasitic bipolar transistor is turned on, the breakdown phenomenon (avalanche breakdown) occurs at a junction formed between impurity region 102 and substrate region 100, so that a current flows from impurity region 102 to substrate region 100 and the high voltage surge applied to node NA is absorbed via substrate region 100 (Substrate region 100 is biased at a prescribed potential level such as a normal ground potential or a negative potential.)

The input protection circuit provided for the signal input pad prevents a destruction of the gate oxide films of MOS transistors PQ and NQ in the internal circuit INC, since even if a high voltage surge is applied to pad PD, the high voltage surge is not transmitted to internal circuit INC.

FIG. 16 is a schematic plan view showing a layout of the field transistor in FIGS. 14 and 15. With reference to FIG. 16, the field transistor has N type impurity region 102 formed in a rectangular shape. Field insulating film 106 is formed to surround N type impurity region 102, and N type impurity region 104 is further formed to surround field insulating film 106. In the structure of the field transistor shown in FIG. 16, the width of field insulating film 106 corresponds to the channel length of the field transistor, and the average length of the inner perimeter and the outer perimeter of field insulating film 106 corresponds to the channel width of the field transistor.

A sufficiently large ratio of the channel width W to the channel length L of the field transistor can be obtained by utilizing the layout shown in FIG. 16. As a result, the current driving capability of field transistor FT can be improved to absorb the surge voltage at a high speed.

Various methods are employed for the input protection circuit in order to absorb the high voltage surge at a high speed and to operate the input protection circuit in a stable state.

FIG. 17 is a schematic plan view illustrating a layout of the input protection circuit. Referring to FIG. 17, resistance element R1 constituted by a diffusion resistance or a polysilicon resistance is connected to conductor lines 112 and 114 which are formed at a first level aluminum interconnection layer placed at its upper layer, respectively via contact holes 122 and 124. Conductor lines 112 and 114 are separated at a portion above a region where resistance element R1 is formed. Conductor line 112 is connected to a conductor line 110 formed at a second level aluminum interconnection layer via a through hole 120. Conductor line 110 is connected to pad PD.

Conductor line 114 in a lateral U-shape form is arranged extending across impurity regions 102 and 104 of the field transistor. Conductor line 114 is electrically connected to impurity region 102 via contact holes 128a and 128b. Impurity region 104 is electrically connected via contact hole 126 to a conductor line 116 formed at the first level aluminum layer and placed in parallel with conductor line 114. A conductor line 118 opposite to conductor line 116 with conductor line 114 therebetween is formed at the first level aluminum interconnection layer. Conductor line 118 is electrically connected to impurity region 104 via contact hole 130, and also connected to a ground line (not shown) formed at the second level layer aluminum interconnection layer located at its upper layer via through hole 132. Conductor lines 114 and 118 extend over the field insulating film and act as gate electrodes of the field transistor.

After passing through the field transistor, conductor line 114 has an end portion electrically connected to one end of resistance element R2 formed of a polysilicon or a diffusion layer via contact hole 134. The other end of resistance element R2 is connected to a conductor line 138 formed at the first level layer aluminum interconnection layer via contact hole 136. Conductor line 138 is electrically connected to the gate and drain of MOS transistor IF and the gate of the MOS transistor in the internal circuit (not shown).

FIG. 18 schematically shows a cross sectional structure taken along the line 17A–17A' shown in FIG. 17. Referring to FIG. 18, the field transistor includes impurity regions 102 and 104 formed at semiconductor substrate region 100 having a space therebetween, and field insulating film 106 formed between impurity regions 102 and 104. Impurity region 104 is connected to conductor line 118 via contact hole 130. Conductor line 118 extends over field insulating film 106, and connected to a conductor line formed at the second level aluminum layer (not shown in FIG. 17) via contact hole 132.

Impurity region 102 is electrically connected to conductor line 114 via contact holes 128a and 128b separated from each other. Impurity region 104 is connected to conductor line 116 formed at the first layer aluminum interconnection layer via contact hole 126.

In the structure shown in FIGS. 17 and 18, contact holes 122, 124, 126, 128a, 128b, 130, 134, and 136 have round shaped edges. By forming the edges of the contact holes into rounded shapes, prevention of concentration of an electric field at the edge portion of the contact hole, as well as prevention of occurrence of a high electric field and concentration of a current at the edge portion of the contact hole are possible.

Further, it is possible to prevent a current generated by the high electric field from locally concentrating and being accelerated to break the PN junction. Similarly, through holes 120 and 132 have rounded edges so that it is possible to prevent acceleration of electrons due to the concentration of the high electric field at the edge portion which causes an open-circuit of an interconnection line due to aluminum migration or the like. Further, these contact holes and through holes have sufficiently large areas to allow a current to spread and flow over a wide area. As a result, an interconnection line is not fused off by the heat generated due to the concentration of the power. Further, conductor lines 110, 112 and 114 respectively have sufficiently wide width, and resistance element R1 also has sufficiently large width, so that occurrence of the fusion thereof caused by the heat generation due to the concentration of the current is prevented.

The areas of impurity regions 102 and 104, and the areas of corresponding contact holes 126, 128a and 128b, and 130 are also made sufficiently large, so that the concentration of the power at impurity regions 102 and 104, and those contact hole portions can be prevented. Since impurity region 102 and conductor line 114 are electrically connected via two contact holes 128a and 128b, the areas of the contact holes are equivalently increased to prevent the occurrence of the concentration of the current.

Edge portions of impurity regions 104 and 102 facing field insulating film 106 are formed into rounded shapes. Accordingly, occurrence of the high electric field at the portion adjacent to the field insulating film to cause degradation of the field insulating film is prevented.

In order to prevent the destruction of the input protection circuit itself due to the high voltage surge as described above, some methods such as (i) to prevent local concentration of power consumption, and (ii) to prevent occurrence of the concentration of the electric field are employed. In order to realize high speed response of the input protection circuit to the high voltage surge, the value of the ratio between the channel length and the channel width of the field transistor, the resistance value of resistance element R2, and the like are optimally determined.

FIG. 19 schematically shows a layout of power supply interconnection lines and signal interconnection lines in the input protection circuit portion. With reference to FIG. 19, an interconnection layout for a pad PD arranged in a central region of a semiconductor chip (LOC (lead-on-chip) structure) is shown as one example.

In FIG. 19, at one side of pad PD, wide metal interconnection lines 140a and 140b are placed and narrow metal interconnection lines 142a and 142b are placed between metal interconnection lines 140a and 140b. Metal interconnection 140b is formed at a layer overlying resistance element R2.

At the other side of pad PD, narrow metal interconnection lines 142c–142f for transmitting a signal are placed, and a wide metal interconnection line 140c are further placed. Wide metal interconnection lines 140a, 140b, and 140c are, for example, a power supply line for transmitting the supply voltage or a ground line for transmitting the ground voltage.

When a high voltage surge is applied to pad PD, a large current of a few amperes, for example, flows through resistance element R1 and field transistor FT. As a result, the Joule's heat is generated at the resistance of resistance element R1 and at the contact portion of the field transistor FT (connection portion of the impurity region and the aluminum conductive layer and the PN junction between the impurity region and the substrate region). The large current could cause fusion of the upper layer metal interconnection line because of the generation of the heat. Therefore, the metal interconnection line is not arranged at a layer overlying resistance element R1 and field transistor FT in the input protection circuit. Under metal interconnection line 140b, resistance element R2 is placed. In this case, the large current has been absorbed by resistance element R1 and field transistor FT already, so that the large current does not flow through resistance element R2 and the amount of the generated heat is small. By placing metal interconnection 140b at the layer overlying resistance element R2, an effective area occupied by resistance element R2 on the chip can be reduced Since an interconnection cannot be made over field transistor FT and resistance element R1, conductor line 114 connecting resistance element R1 and field transistor FT is formed to have an L-shape, and pad PD, resistance element R1 and field transistor FT are arranged in a line in order to reduce the chip area occupied by field transistor FT and resistance element R1 in the input protection circuit. Accordingly, the effective area occupied by the input protection circuit on the chip is reduced. (The area of the interconnection is kept as large as possible.)

In the input protection circuit, the minimum value of the energy of the high voltage surge to be absorbed is absolutely determined (e.g. the high voltage surge is 2000V in the case of the discharging from the human body), making the reduction of the layout area difficult. Especially, in order to avoid concentration of the power consumption in the input protection circuit when the high voltage surge is applied, the minimum values of the line width of resistance element R1, and the areas of the impurity region and the contact portion of the field transistor are determined independently of the chip size of the semiconductor device. Further, since various methods for avoiding concentration of the electric field and the power are employed in the layout of the input protection circuit as describe above, modification of the layout of the input protection circuit is not easy to make.

The ratio of the area of the input protection circuit to the semiconductor chip area is increasing. The area of the input protection circuit occupying the chip area is further increasing with the miniaturization of the interconnection pattern.

In order to make the occupation area of the input protection circuit as small as possible, pad PD, resistance element R1, and field transistor FT are aligned to make the area where the interconnection line can be placed as large as possible as shown in FIG. 19. The pad is arranged aligning along the direction of the alignment thereof since normally the interconnection is not arranged in this region. (A bonding wire is connected to pad PD.)

An efficient layout for reducing the interconnection area cannot be obtained since the metal interconnection line cannot be arranged at a layer overlying the input protection circuit. As a result, it becomes impossible to reduce the area occupied by the interconnection.

FIG. 20 shows an arrangement of the input protection circuits for a plurality of pads. Referring to FIG. 20, pads PDa–PDn are alignedly arranged. Input protection circuits IPCa–IPCn are provided respectively for pads PDa–PDn. Input circuits INCa–INCn are provided respectively corresponding to input protection circuits IPCa–IPCn. Transistors of input circuits INCa–INCn as their components are miniaturized for higher integration. On the other hand, the components of input protection circuits IPCa–IPCn cannot be scaled down according to the miniaturization of input circuit INCa–INCn, and their absolute sizes are predetermined. As the number of pads PDa–PDn increases, the ratio of the area of input protection circuits IPCa–IPCn which occupies the semiconductor chip increases to impede the reduction of the chip size. When the number of such input pads PDa–PDn increases, the number of input protection circuits IPCa–IPCn accordingly increases. As a result, the region where the interconnection cannot be arranged increases to prevent reduction of the interconnection layout area, and efficient reduction of the layout area of the interconnection becomes impossible.

SUMMARY OF THE INVENTION

An object of the present invention is to provide a semiconductor integrated circuit device having a protection circuit to enable efficient reduction of the chip area.

Another object of the invention is to provide a semiconductor integrated circuit device to enable efficient reduction of the interconnection layout area.

A semiconductor integrated circuit device according to the invention is generally structured such that a sufficiently wide metal interconnection line is arranged at a layer overlying a protection circuit such as an input protection circuit.

At least a part of the protection circuit for absorbing a high voltage surge at a pad is covered with a conductive layer formed at an upper layer. A conductor line can thus be arranged at the upper layer over the protection circuit. As a result, an efficient layout of the conductor line and the reduction of the layout area becomes possible.

The protection circuit is arranged at a layer underlying the conductor line. As a result, a portion covered with the conductor line in the area of the protection circuit overlaps the layout area of the conductor line. The area of the chip occupied by the protection circuit can be reduced in appearance.

The upper layer conductor line absorbs the heat generated in the protection circuit and exerts a cooling effect on the protection circuit. Accordingly, it is possible to prevent the protection circuit from being destructed due to the generation of the heat, and to realize a protection circuit having an enhanced resistance to the surge.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

FIG. 1 shows a structure of a main portion of a semiconductor integrated circuit device according to the first embodiment of the invention. Referring to FIG. 1, an input protection circuit IPC is arranged adjacent to a pad PD. A metal interconnection line 1 as a conductor line is placed covering at least a part of input protection circuit IPC, at a layer overlying input protection circuit IPC. Metal interconnection 1 is, for example, a power supply line or a ground line, and has a sufficiently large width (e.g. 10 $\mu$). It is only necessary to form metal interconnection line 1 at an interconnection layer overlying an interconnection layer (a first level aluminum interconnection layer) which interconnects the components of input protection circuit IPC. Metal interconnection line 1 having a high thermal conductivity is formed by, for example, a second level aluminum interconnection layer.

Input protection circuit IPC is connected to pad PD via a conductor line 2 formed by, for example, the second level aluminum interconnection layer.

Figure 1A:
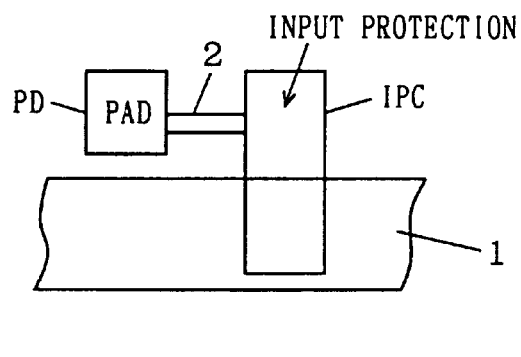
FIGS. 1A and 1B schematically show a structure of a main portion of a semiconductor integrated circuit device according to the first embodiment of the invention.
Figure 1B:
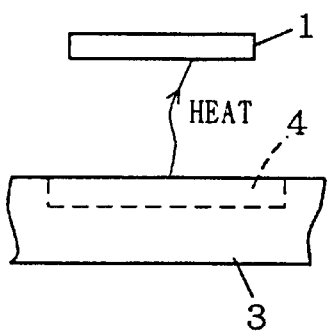

As shown in FIG. 1B, a region for forming an input protection circuit 4 is arranged at a surface of a semiconductor substrate region 3. An input protection circuit is formed in region 4. When a high voltage surge is applied to pad PD, a current generated by the high voltage surge flows into input protection circuit IPC. The heat generated due to the Joule's heat is absorbed by metal interconnection line 1 formed at the upper layer. (The heat is dispersed and absorbed.)

Metal interconnection line 1 having a sufficiently large width is, for example, a power supply line or a ground line, and capable of dispersing and cooling the heat generated in input protection circuit formation region 4. The heat generated at the input protection circuit can be dissipated efficiently, by dispersing and cooling the heat generated in input protection circuit formation region 4 by the upper layer metal interconnection line 1. Accordingly, the thermal emissionability of the input protection circuit can be improved to prevent a destruction through degradation of the characteristics of the resistance element or the PN junction due to the heat generation in the input protection circuit. The high voltage surge is reliably absorbed and an input protection circuit having an enhanced resistance to the surge can be obtained.

Referring to FIG. 1A, metal interconnection line 1 is arranged at the layer over input protection circuit IPC to cover at least a part thereof, so that an area for arranging input protection circuit IPC can also be used as an area for arranging metal interconnection line 1, and an area on a semiconductor chip occupied by the input protection circuit can be reduced effectively. Since metal interconnection line 1 can be placed at the layer over input protection circuit IPC, the flexibility of the layout of metal interconnection line 1 is improved to effectively reduce the layout area of metal interconnection line 1.

Since the metal interconnection line has a sufficient width, the thermal conductivity of metal interconnection line 1 is high enough to efficiently disperse and cool the heat generated in input protection circuit IPC. Accordingly, fusion of metal interconnection line 1 due to the heat from input protection circuit IPC could not occur.

According to the first embodiment of the invention, the heat generated by the high voltage surge in the input protection circuit can be efficiently dispersed and cooled, since a metal interconnection line having a large width and a superior thermal conductivity is placed covering at least a part of the input protection circuit at a layer overlying the input protection circuit. An input protection circuit having an improved resistance to the surge can thus be obtained. Further, the upper layer metal interconnection line is placed covering at least a part of the input protection circuit, so that an area on the chip occupied by the input protection circuit can be reduced equivalently, compared with the conventional one, by the portion of the input protection circuit covered by the metal interconnection line. A layout area of the input protection circuit on the chip can thus be reduced, resulting in reduction of the chip area.

[Second Embodiment]

Figure 2:
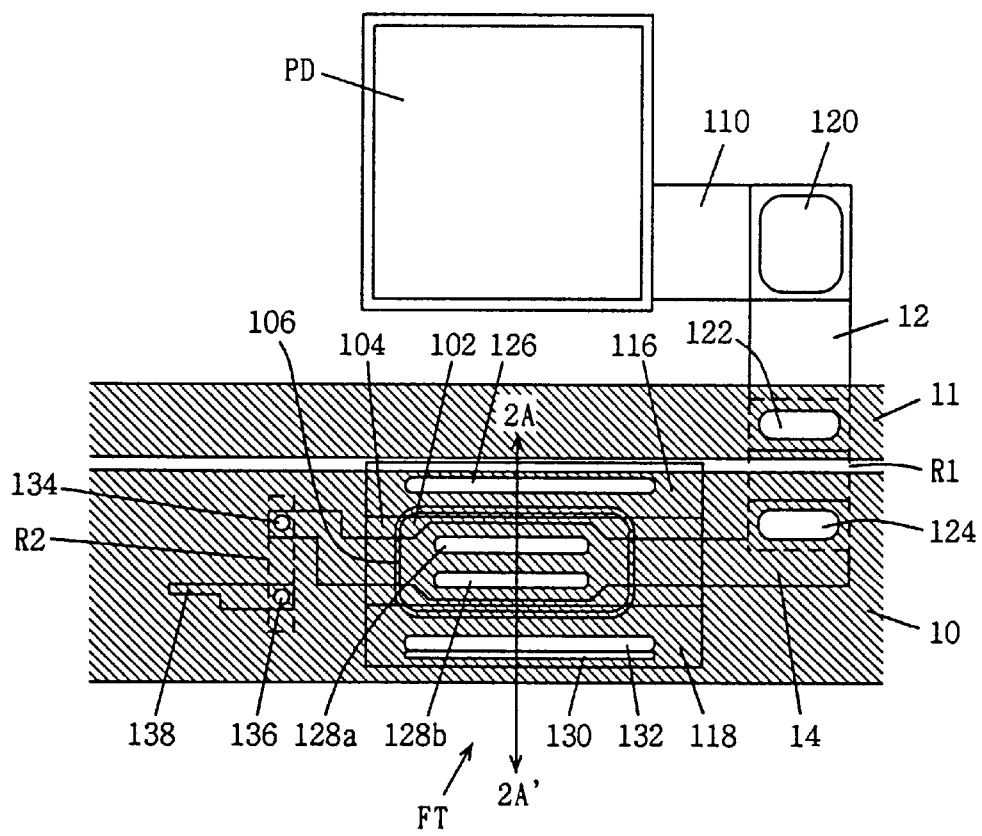
FIG. 2 schematically shows a structure of a main portion of a semiconductor integrated circuit device according to the second embodiment of the invention.

FIG. 2 schematically shows a layout of an input protection circuit according to the second embodiment. Referring to FIG. 2, the input protection circuit includes a resistance element R1 and a field transistor FT. One end of resistance element R1 is connected to a conductor line 12 which is, for example, a first level aluminum interconnection line via a contact hole 122. Conductor line 12 is also connected to a conductor line 110 formed at a second level aluminum interconnection layer placed perpendicular to conductor line 12 via a through hole 120. Conductor line 110 is electrically connected to pad PD.

The other end of resistance element R1 is connected to a conductor line 14 formed at the first layer aluminum interconnection layer via a contact hole 124. Conductor line 14 is arranged extending in a direction perpendicular to resistance element R1.

Conductor line 14 is electrically connected to an impurity region 102 of field transistor FT via two contact holes 128a and 128b, and further connected to one end of a resistance element R2 via a contact hole 134.

An impurity region 104 formed surrounding impurity region 102 in field transistor FT is connected to a conductor line 116 at the first level aluminum interconnection layer via a contact hole 126. Impurity region 104 is further connected to a conductor line 118 formed of the first level aluminum interconnection layer via a contact hole 130. Conductor line 118 is connected to a ground line via a through hole 132. Conductor lines 116 and 118 are placed opposite to each other with conductor line 14 therebetween. Conductor lines 116 and 118 are respectively formed over a field insulating film provided between impurity regions 102 and 104, and act as gate electrodes of field transistor FT.

The other end of resistance element R2 is connected to a conductor line 138 formed at the first layer aluminum interconnection layer via a contact hole 136. Conductor line 138 is connected to an IF transistor and an input circuit (not shown).

A ground line 10 formed at the second level aluminum interconnection layer is placed to cover resistance element R2, field transistor FT, and a part of resistance element R1 (especially contact hole portion 124). Adjacent to ground line 10, a conductor interconnection line 11 which is, for example, a power supply line transmitting the power supply voltage and is formed at the second level aluminum interconnection layer, is placed to cover the remaining part of resistance element R1 (especially contact hole portion 122).

Figure 17:
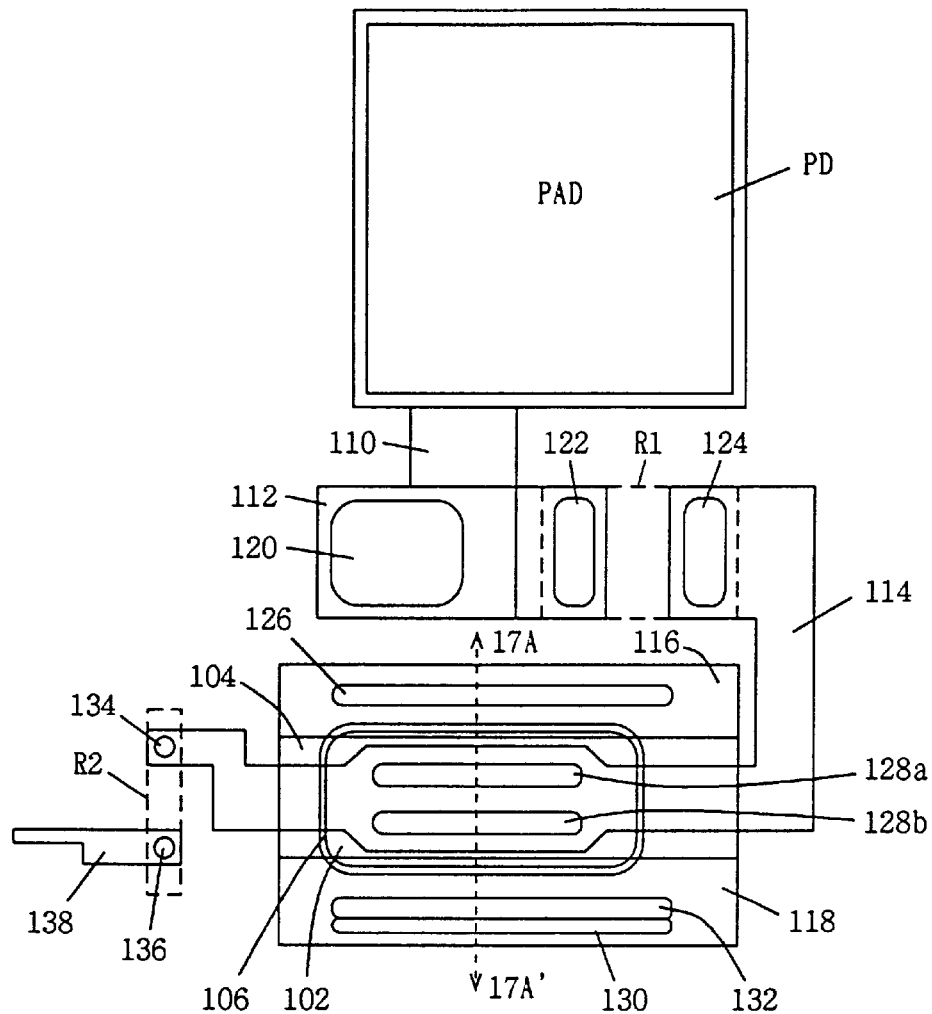
FIG. 17 is a schematic plan view of a layout of the conventional input protection circuit.
Figure 18:
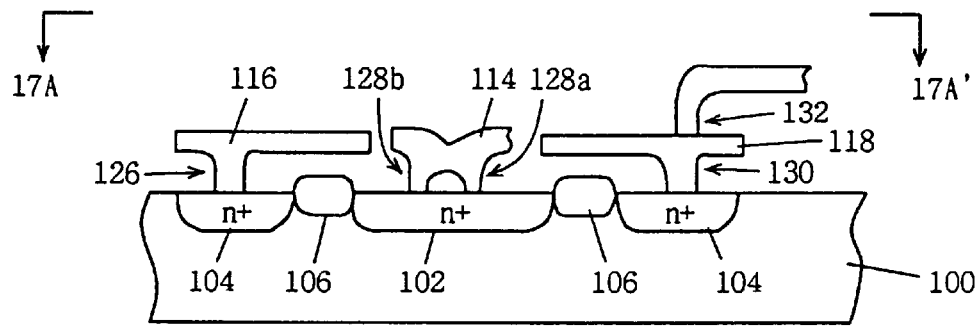
FIG. 18 is a schematic cross sectional structure taken along the line 17A–17A' in FIG. 17.
Figure 19:
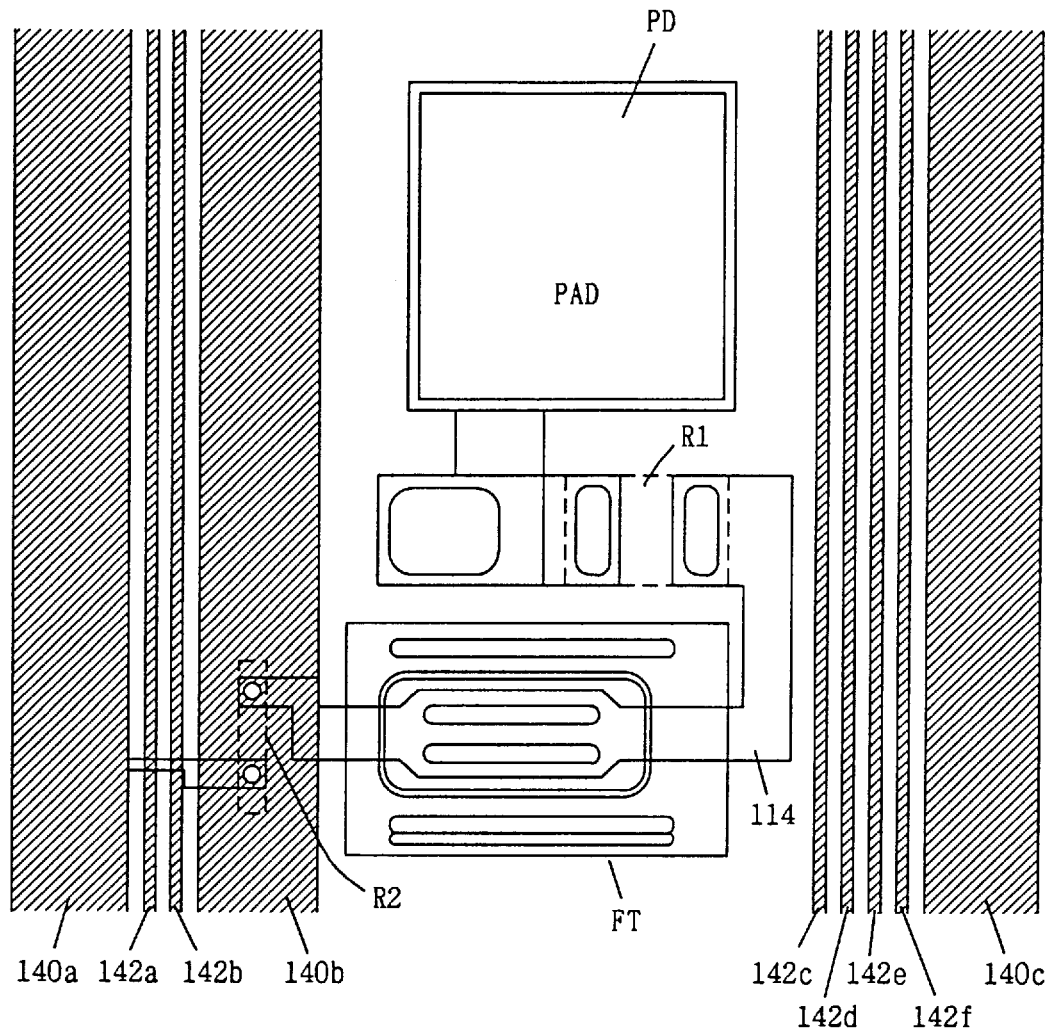
FIG. 19 is a schematic view of an interconnection layout in the conventional semiconductor integrated circuit device.
Figure 20:
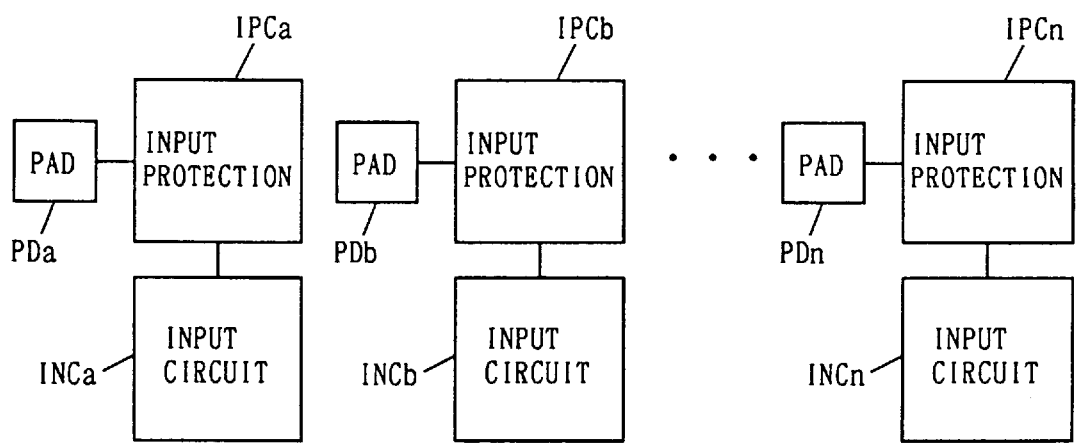
FIG. 20 is an illustration related to a problem of the conventional semiconductor integrated circuit device.

The layout of field transistor FT shown in the plan view is similar to that shown in FIG. 17. Each parameter of resistance element R1 is also identical to that of resistance element R1 shown in FIG. 17. The only difference is that conductor line 14 is placed in the direction orthogonal to the direction in which resistance element R1 extends placed so that resistance element R1 and the region for formation of the field transistor are arranged so as to constitute an L-shape. Accordingly, the input protection circuit can be provided without changing the layout pattern of the conventional field transistor FT and resistance element R1. Conductor interconnections 10 and 11 are provided at the upper layer to cover field transistor FT and a part of resistance element R1. The input protection circuit and conductor interconnections 10 and 11 are placed overlapping each other, thereby effectively reducing the layout area of the input protection circuit on the chip.

Further, sufficiently wide ground line 10 or conductor interconnection 11 are placed at a layer over field transistor FT and resistance element R1 so that the heat generated in field transistor FT and resistance element R1 can be efficiently absorbed by conductor interconnections 10 and 11. Conductor interconnections 10 and 11 are aluminum interconnections having high thermal conductivity. Accordingly, the heat generated in the input protection circuit can be diffused efficiently and the input protection circuit can thus be operated in a stable state. Since the width of conductor interconnections 10 and 11 is large, for example, at least 10 µm and they are extended over a long distance, and therefore the generated heat can be dispersed and absorbed to prevent fusion of the input protection circuit (field transistor FT and resistance element R1) due to the heat generation.

Although there is a gap between conductor interconnections 11 and 10 in the arrangement shown in FIG. 2, contact hole portions 122 and 124 of resistance element R1 are completely covered by conductor interconnections 11 and 10 located at their upper layer. Accordingly, the heat generated by the contact resistance at contact hole portions 122 and 124 is reliably absorbed. Further, most part of resistance element R1 is covered with conductor interconnections 10 and 11 so that the heat generated from resistance element R1 can be absorbed efficiently by conductor interconnections 10 and 11. Although the gap between conductor interconnections 10 and 11 is caused since they are provided as separate interconnections, a positive use of the gap enables the heat generated in resistance element R1 not to be locked up internally (confinement of heat) before absorbed by the conductor interconnections. As a result, the heat which has not been absorbed can be diffused to provide an efficient cooling.

Note that conductor interconnection 12 placed opposite to conductor interconnections 10 and 11 with respect to pad PD, is formed at the second level aluminum interconnection layer, and is arranged to show that pad PD is located at the central portion of the semiconductor chip according to the LOC structure as one example. An input protection circuit connected to another pad (not shown) may be placed under conductor interconnection 12.

Where pad PD is provided along the peripheral portion of the semiconductor chip ("peripheral pad" arrangement), conductor interconnection 12 is not provided.

Figure 3:
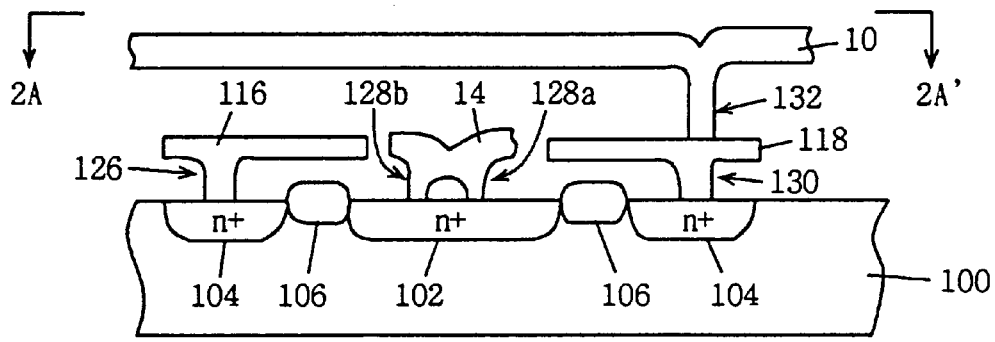
FIG. 3 schematically shows a cross sectional structure taken along the line 2A–2A' shown in FIG. 2.

FIG. 3 schematically shows a cross sectional structure taken along the line 2A–2A' in FIG. 2. Referring to FIG. 3, impurity regions 102 and 104 are formed spaced apart from each other at a surface of a semiconductor substrate region 100. Between impurity regions 102 and 104, a field insulating film 106 is provided. Conductor line 14 connected to impurity region 102 via contact holes 128a and 128b is formed over impurity region 102. Conductor interconnections 116 and 118 connected to impurity region 104 are formed at a layer at which conductor line 14 is formed. Conductor interconnections 116 and 118 are connected to impurity regions 104 through contact holes 126 and 130 respectively.

As shown in FIG. 2, conductor interconnections 116 and 118 are electrically connected since impurity region 104 is one continuous impurity region. Conductor interconnections 116 and 118 extend over field insulating film 106 and function as the gate electrode of field transistor FT. Conductor interconnection 10 is formed at the second level aluminum interconnection layer to cover conductor interconnections 116, 14, and 118 at their respective upper layer portions. Conductor interconnection 10 is a ground line transmitting the ground voltage. Ground line 10 is connected to conductor interconnection 118 via through hole 132. Ground line 10 is made sufficiently wide for supplying the ground voltage in a stable state.

When ground line 10 is used as conductor interconnection as shown in FIG. 3, ground line 10 for supplying the ground voltage to the gate of field transistor FT and the source region of the impurity region (impurity region 104) can be placed at the layer overlying field transistor FT. Accordingly, it is not necessary to provide the ground voltage to impurity region 104 from a ground line provided at a different portion, and an efficient interconnection and the reduction of the interconnection layout area become possible.

According to the second embodiment of the invention, a wide conductor line is placed at a layer over the resistance element and the field transistor of the input protection circuit to cover almost the entire portion of the resistance element and the field transistor. As a result, the layout area of the input protection circuit on the chip can be reduced effectively and the chip area can thus be reduced. Further, the upper layer conductor interconnections 10 and 11 are, for example, aluminum interconnections 10 and 11 are, for example, aluminum interconnections having sufficiently large width and high thermal conductivity. Therefore, there is no problem concerning the thermal emissionability and the resistance to melting, and the heat generated from the input protection circuit is surely dispersed and cooled down. By absorbing (cooling) the heat in the input protection circuit efficiently by the upper layer diffusing interconnection, the increase of the temperature of the input protection circuit portion is suppressed, destruction of the resistance element or the PN junction by the heat generated due to the large current in the input protection circuit when the voltage surge is applied can be prevented, and the input protection circuit having a superior resistance to the surge can be obtained.

By utilizing a ground line as the upper layer conductor interconnection, the ground voltage can be easily supplied to the field transistor, thereby realizing an efficient interconnection layout.

[Third Embodiment]

Figure 4:
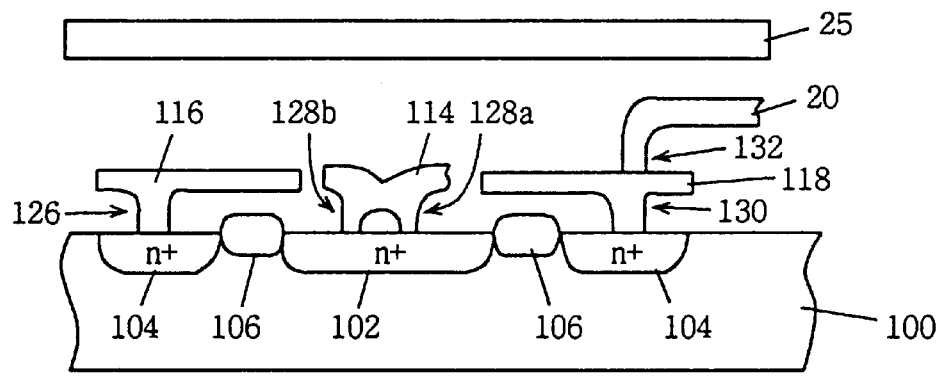
FIG. 4 schematically shows a cross sectional structure of a field transistor portion of a semiconductor integrated circuit device according to the third embodiment of the invention.

FIG. 4 schematically shows a structure of a main portion of a semiconductor integrated circuit device according to the third embodiment. With reference to FIG. 4, a cross sectional structure of the field transistor portion is schematically shown. The layout shown by the plan view according to the third embodiment is similar to that shown in FIG. 2. According to the third embodiment, a conductor line 118 constituting a metal gate of the field transistor is connected to a conductor line 20 formed at the second level aluminum interconnection via through hole 132. Conductor line 20 is electrically connected to a ground line at a portion not shown in this figure.

In the third embodiment, a conductor line 25 formed at a third level aluminum interconnection layer is provided to cover the entire field transistor. Conductor line 25 may be a power supply line transmitting the supply voltage, or may be a ground line transmitting the ground voltage. It is only necessary for conductor line 25 to have a sufficient width and a sufficient length for dispersing the heat.

As shown in FIG. 4, the aluminum interconnection formed at the uppermost third level layer is a power supply line or a ground line in the three-level metal interconnection structure. The aluminum interconnection has a sufficient width and length and has an effect similar to that according to the second embodiment.

[Modification]

Figure 5:
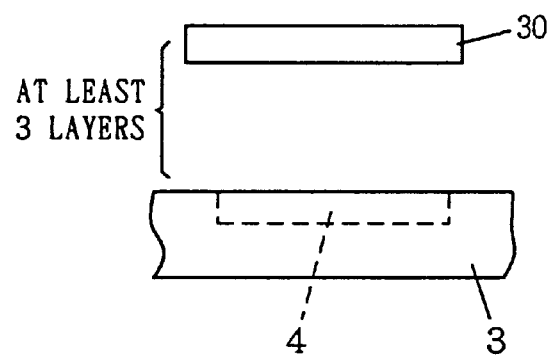
FIG. 5 is a schematic view illustrating a structure of a modification of the third embodiment of the invention.

FIG. 5 schematically shows a structure of a modification of the third embodiment. Referring to FIG. 5, a conductor line 30 having a sufficiently large width and aluminum interconnection or the like is placed to cover a region for formation of an input protection circuit 4 formed at the surface portion of a semiconductor substrate region 3. Conductor line 30 is a metal interconnection line located at the uppermost layer in an MOS integrated circuit having a multilevel metal interconnection structure. The metal interconnection line at the uppermost layer in the multilevel metal interconnection structure is usually used as a power supply line or a ground line, and has a sufficient width. In the multilevel metal interconnection structure having at least three-level layers, by providing metal interconnection line (e.g. aluminum interconnection) 30 having a sufficiently large width and a superior thermal conductivity at the uppermost layer to cover input protection circuit formation region 4, the heat generated in the input protection circuit can be absorbed efficiently and the input protection circuit can be cooled down efficiently.

According to the third embodiment of the invention, the heat from the input protection circuit is absorbed to be cooled down efficiently since a wide metal interconnection line is placed at an upper layer in at least three-level layers to cover the input protection circuit.

An effect similar to that of the second embodiment can also be obtained.

[Fourth Embodiment]

Figure 6:
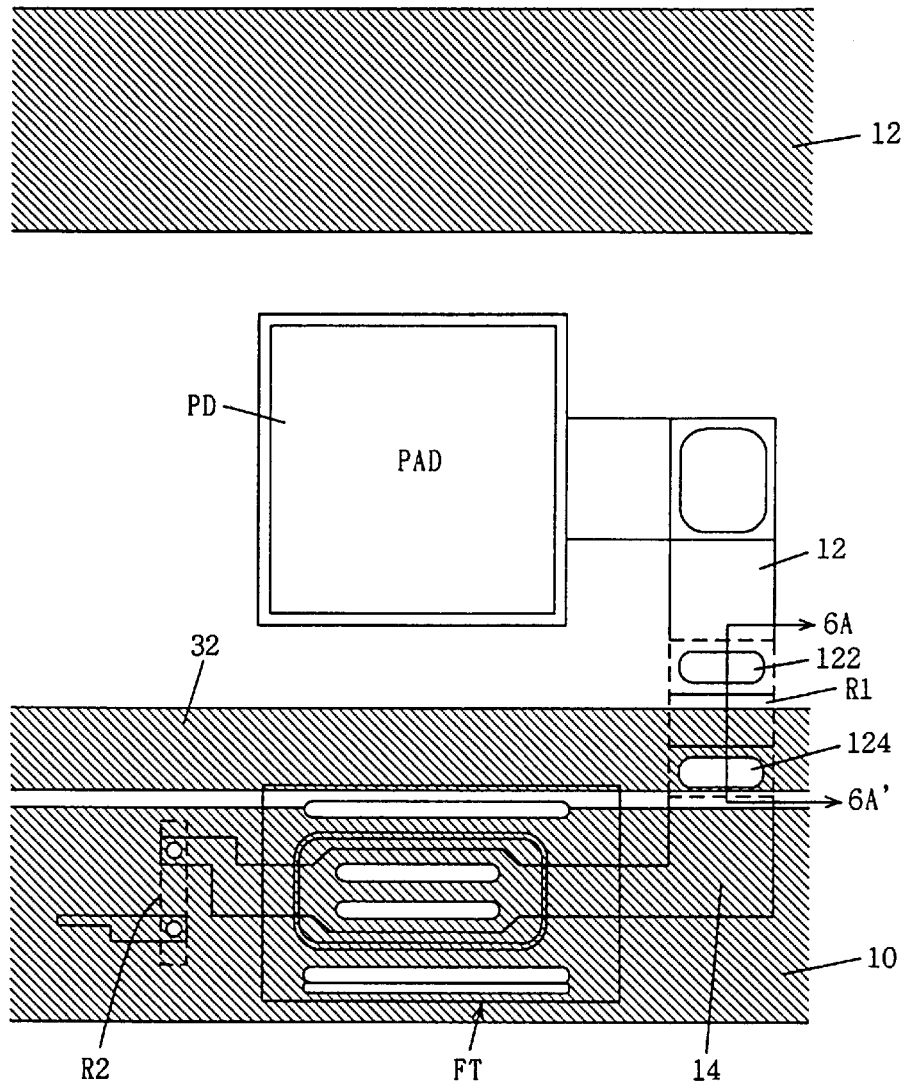
FIG. 6 is a schematic view showing a structure of a main portion of a semiconductor integrated circuit device according to the fourth embodiment.

FIG. 6 schematically shows a structure of a main portion of a semiconductor integrated circuit device according to the fourth embodiment. In the structure shown in FIG. 6, a conductor line 32 formed at a layer overlying resistance element R1, for example, at the second layer aluminum interconnection layer, is provided to cover a part of resistance element R1. A region adjacent to a region connected to conductor line 12 of resistance element R1 via contact hole 122 is not covered with the conductor line. Contact hole 124 of resistance element R1 and a region adjacent thereto is covered with conductor line 32. The structure except the portion described above has a same structure as that shown in FIG. 2, and the components corresponding thereto have the same reference characters. No reference character is provided for field transistor FT for simplification of the figure. Field transistor FT and resistance element R2 is covered with conductor line 10 formed at, for example, the second level aluminum interconnection layer as in the second embodiment.

Figure 7:
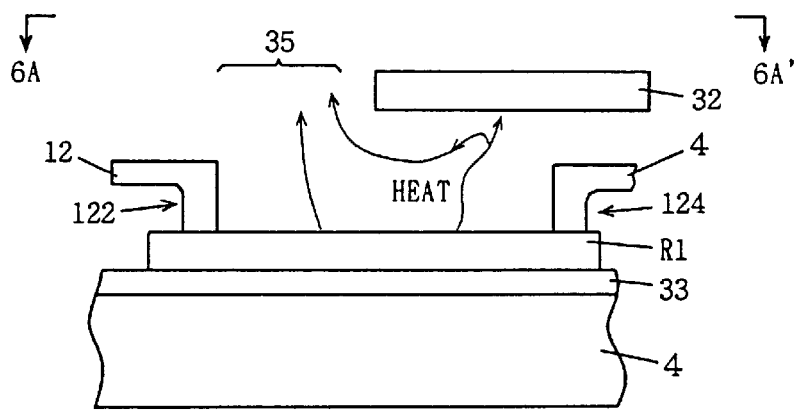
FIG. 7 shows a schematic cross sectional structure taken along the line 6A–6A' in FIG. 6.

FIG. 7 schematically shows a cross sectional structure taken along the line 6A–6A' in resistance element R1 shown in FIG. 6. Referring to FIG. 7, resistance element R1 formed of, for example, polysilicon is provided at a surface of input protection circuit formation region 4 with an insulating film 33 underlaid. One end of resistance element R1 is electrically connected to conductor line 12 via contact hole 122, and the other end of resistance element R1 is electrically connected to conductor line 4 via contact hole 124. Conductor line 32 is placed at a layer overlying contact hole 124 and a region adjacent to the contact hole. Conductor line 32 does not cover the entire portion of resistance element R1. A large amount of current generated by a high voltage surge in resistance element R1 generates heat. A portion where conductor line 32 is not formed is provided at a layer overlying resistance element R1 in order to avoid a situation in which the generated heat is confined before dispersed and cooled by the upper layer conductor line 32 and resistance element R1 cannot be cooled efficiently (the heat is subsequently dispersed and cooled by conductor line 32). Through the gap portion 35, the heat generated from resistance element R1 is diffused to prevent the heat from resistance element R1 from being locked up in before cooled by conductor line 32. The confinement of the heat can thus be avoided, and resistance element R1 can be cooled efficiently by diffusion of the heat from gap portion 35 and by dispersing and cooling of the heat by conductor line 32.

Although resistance element R1 is constituted by a polysilicon resistance in the structure shown in FIG. 7, resistance element R1 may be constituted by a diffusion resistance utilizing an impurity region.

According to the fourth embodiment, a conductor line is placed at an upper layer to only partially cover the resistance element electrically connected to pad PD. Accordingly, the heat generated from the resistance element is not confined to stay before dispersed and cooled by a conductive layer locating at the upper layer, and thus efficient cooling can be realized.

[Fifth Embodiment]

Figure 8:
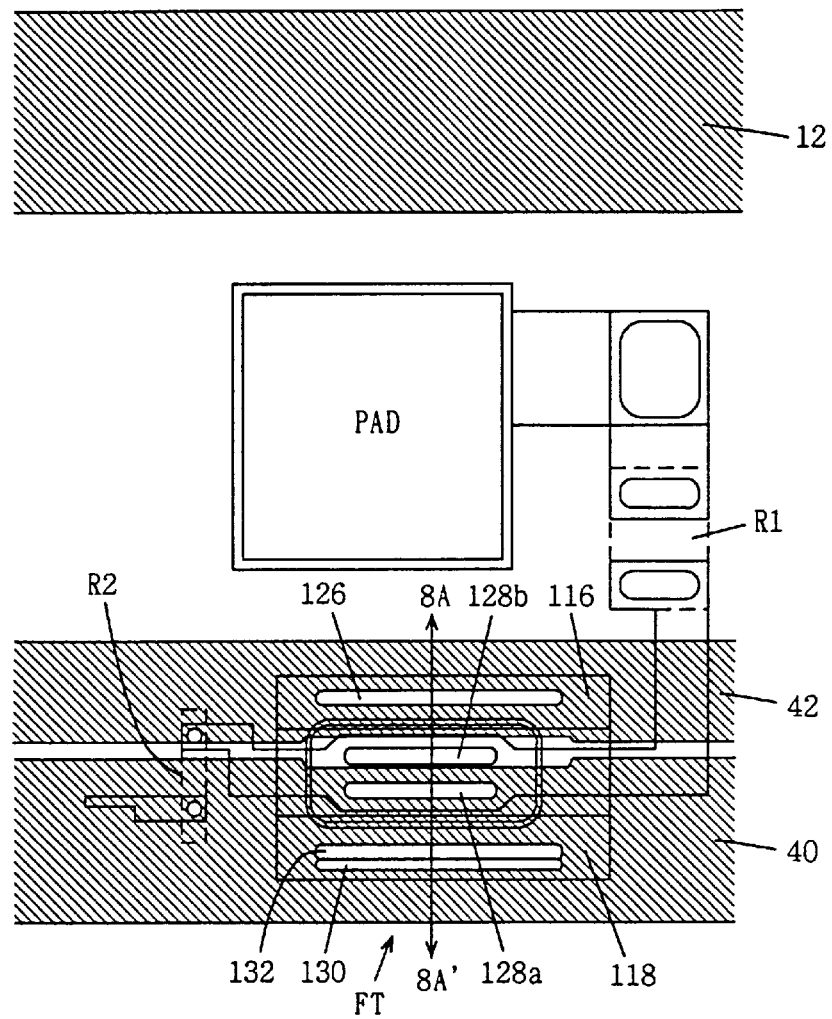
FIG. 8 is a schematic view illustrating a structure of a main portion of a semiconductor integrated circuit device according to the fifth embodiment.

FIG. 8 schematically shows a structure of a main portion of a semiconductor integrated circuit device according to the fifth embodiment. Referring to FIG. 8, conductor lines 40 and 42 formed at, for example, the second level aluminum interconnection layer, are arranged in parallel with each other having a gap portion therebetween and covering field transistor FT. There is a portion (region of contact hole portion 128b) of field transistor FT where conductor lines 40 and 42 do not cover (the gap portion is made wider.) No conductor layer is provided at a layer overlying resistance element R1. Other structures other than the above are similar to those shown in FIG. 2, and the components corresponding thereto have the same reference characters. Two conductor lines 40 and 42 are arranged at a layer overlying field transistor FT in parallel with each other with a space therebetween. The space is made wider in the region of contact holes 128a and 128b where a large amount of heat is generated. Similar to the fourth embodiment, the generated heat does not stay internally different from the case in which field transistor FT is completely covered by the conductor line, thereby realizing an efficient diffusion of the heat.

Figure 9:
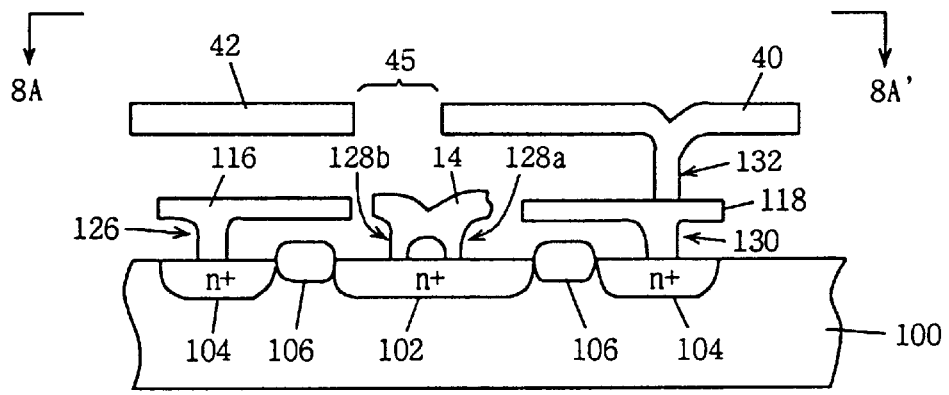
FIG. 9 is a schematic cross sectional structure taken along the line 8A–8A' in FIG. 8.

FIG. 9 schematically shows a cross sectional structure taken along the line 8A–8A' in FIG. 8. In the cross sectional structure shown in FIG. 9, the components corresponding to those in the cross sectional structure of FIG. 3 have the same reference characters.

With reference to FIG. 9, conductor line 40 is shown as a ground line transmitting the ground voltage as one example. Conductor line 118 connected to impurity region 104 via contact hole 130 is connected to conductor line 40 located at its upper layer via through hole 132. Conductor line 40 is provided to cover conductor line 118 and a part of conductor line 14. The portion of contact hole 128a in field transistor FT is covered with conductive layer 40.

Conductor line 42 placed at a layer overlying conductor line 116 is formed covering only conductor line 116. Conductor line 42 covering the portion of contact hole 126 does not cover conductor line 14. Accordingly, the heat generated from a large amount of current produced when a high voltage surge is applied can be diffused efficiently at field transistor FT via a region between conductor lines 40 and 42. Specifically, confinement of the heat before the heat is dispersed and cooled which may occur then the region is completely covered with the conductor line is prevented. The confined heat is efficiently diffused via region 45. The residual heat is efficiently dispersed and cooled by conductor lines 40 and 42. The heat from resistance element R1 is diffused to its upper layer similarly to the conventional method.

According to the fifth embodiment, a conductor line is placed to partially cover the field transistor at its upper layer. As a result, the confinement of the heat before the heat is dispersed and cooled which may occur when the conductor line is placed to cover the entire portion of the field transistor can be prohibited efficiently. The heat generated at the field transistor can be absorbed to be cooled efficiently by the upper layer conductor line.

[Sixth Embodiment]

Figure 10:
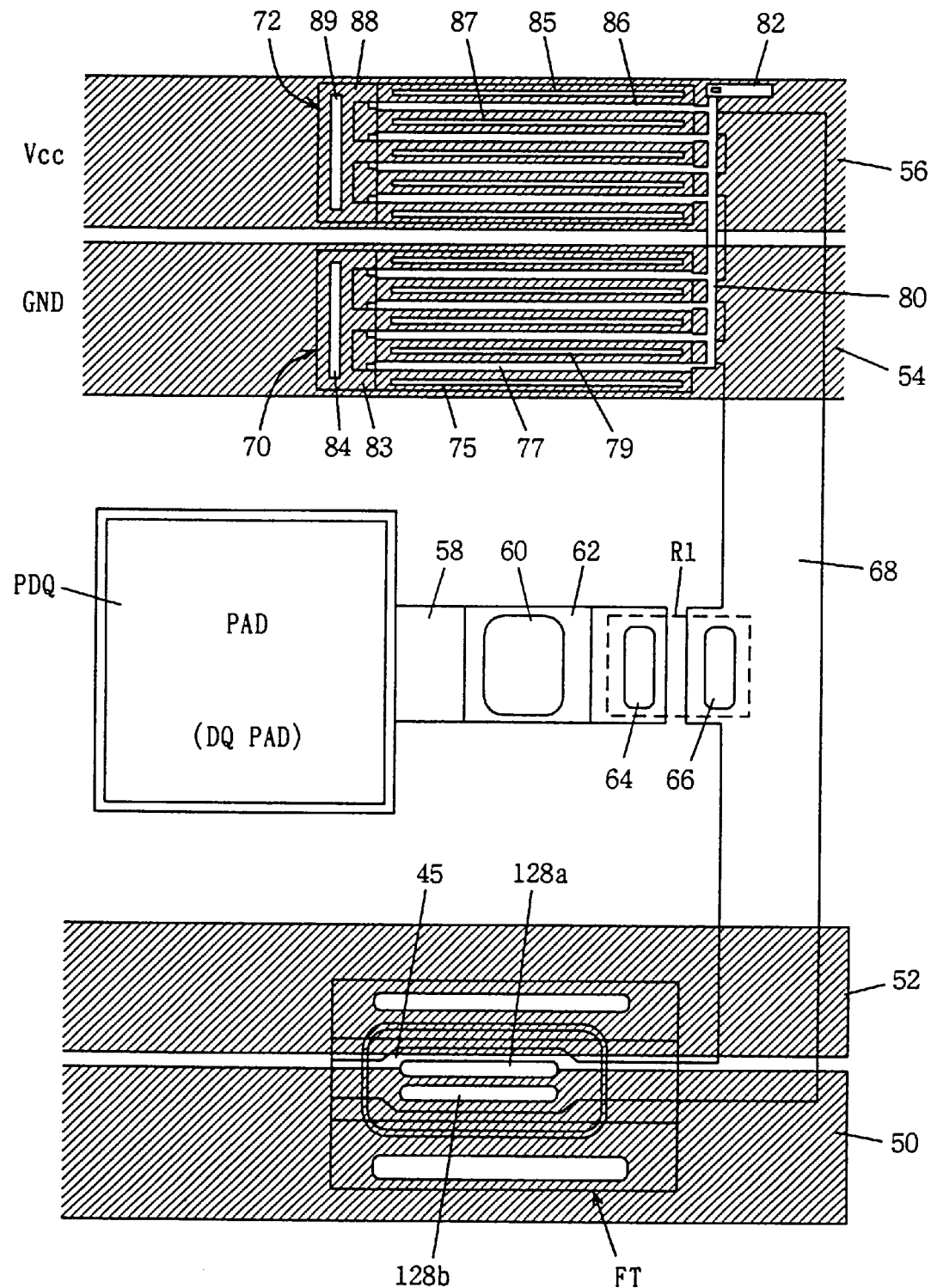
FIG. 10 is a schematic view of a structure of a main portion of a semiconductor integrated circuit device according to the sixth embodiment.

FIG. 10 schematically shows a structure of a main portion of a semiconductor integrated circuit device according to the sixth embodiment. Referring to FIG. 10, conductor lines 50 and 52 are placed in parallel with each other and having a gap portion therebetween at one side of a pad PDQ, and conductor lines 54 and 56 are placed in parallel with each other at the other side of pad PDQ. Field transistor FT is formed below conductor lines 50 and 52. At field transistor FT, conductor lines 50 and 52 are not provided at a portion above region 45, and region 45 provides a gap region for diffusing the heat. Specifically, conductor lines 50 and 52 are not provided at a layer overlying a region of contact hole 128a. At the layer overlying contact hole 128b, conductor line 50 is arranged.

The arrangement of field transistor FT and conductor lines 50 and 52 at its upper layer is similar to that shown in FIG. 8. A difference is that resistance element R2 is not connected to field transistor FT in the structure shown in FIG. 10.

Pad PDQ is connected to conductor line 58 at the second level aluminum interconnection layer. Conductor line 58 is electrically connected to conductor line 62 at the first level aluminum interconnection layer via through hole 60. Conductor line 62 is connected to one end of resistance element R1 via contact hole 64. The other end of resistance element R1 is connected via contact hole 66 to conductor line 68 constituted by the first layer aluminum interconnection layer extending in the vertical direction in the figure. Conductor line 68 extends in the direction toward field transistor FT, and electrically connected to the impurity region of field transistor FT via contact holes 128a and 128b thereof.

Conductor line 68 further extends in the direction opposite to the above-said direction to a portion below conductor lines 54 and 56. Conductor line 54 is a ground line transmitting the ground voltage, and conductor line 56 is a power supply line transmitting the supply voltage. At a portion below conductor line 54, a region 70 for formation of an n channel MOS transistor included in an output circuit is placed. At a portion below power supply line 56 transmitting supply voltage Vcc, a region 72 for formation of a p channel MOS transistor included in the output circuit is arranged. By providing output transistors included in an output circuit at a portion below conductor line 56 as a power supply line and a portion below a conductor line 54 as a ground line, an area occupied by output transistors having a high current driving capability for the output circuit can be reduced effectively.

At n channel MOS transistor formation region 70, contact hole 75, gate electrode 77 and contact hole 79 extending along the direction in which conductor line 54 is extended are placed in this order. Contact hole 75 electrically connects a source impurity region of n channel MOS transistor formation region 70 to conductor line 83 formed of the first level aluminum interconnection layer. Gate electrode 77 is connected to conductor line 80 formed of the first level polysilicon interconnection layer. Conductor line 80 extends over region 72 for formation of a p channel MOS transistor, and connected to the first level aluminum interconnection layer 82. The first level aluminum interconnection layer 82 is electrically connected to an internal circuit (not shown). Contact hole 79 electrically connects an impurity region of n channel MOS transistor formation region 70 to conductor line 68. Conductor line 83 is connected to conductor line 54 locating at its upper layer via contact hole 84.

Contact hole 85, gate electrode 86 and contact hole 87 are arranged in this order at p channel MOS transistor formation region 72. Contact hole 85 electrically connects an impurity region (source region) of p channel MOS transistor formation region 72 to conductor line 88 formed of the overlying first level aluminum interconnection layer. Conductor line 88 is electrically connected to conductor line 56 as a power supply line at its upper layer via contact hole 89.

Gate electrode layer 86 is electrically connected to conductor line 80. Contact hole 87 connects an impurity region (drain region) of p channel MOS transistor formation region 72 to conductor line 68.

Figure 11:
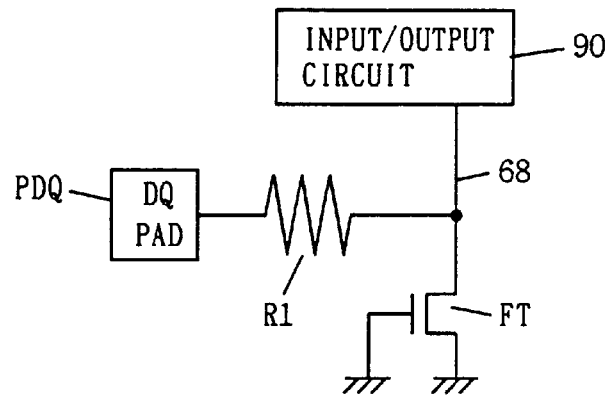
FIG. 11 schematically shows an electrical equivalent circuit of the semiconductor integrated circuit device shown in FIG. 10.

FIG. 11 shows an electrically equivalent circuit of the protection circuit shown in FIG. 10. Referring to FIG. 11, a DQ pad PDQ is electrically coupled to conductor line 68 via resistance element R1. Conductor line 68 is connected to an input/output circuit 90 for the input and output of data at one side, and connected to one conduction terminal (drain) of the field transistor FT at the other side. Input/output circuit 90 includes MOS transistors (70 and 72) for output shown in FIG. 10. A power supply line and a ground line are placed over input/output circuit 90. Conductor lines 50 and 52 shown in FIG. 10 are placed at a layer overlying field transistor FT to cover field transistor FT (except for a gap). DQ pad PDQ transmits and receives a data signal to and from input/output circuit 90.

As shown in FIGS. 10 and 11, protection of input/output circuit 90 from an external high voltage surge is possible by providing resistance element R1 and field transistor FT in the case in which the pad is the DQ pad for input/output of the data signal.

The heat generated in field transistor FT can be diffused efficiently by arranging a conductor line at an upper layer to cover field transistor FT as in the fifth embodiment. Further, since field transistor FT is not completely covered (there is gap region 45), confinement of the heat before cooling of the heat by the upper layer conductor line can be prevented to enable an efficient diffusion of the heat. Since the field transistor is placed below conductor lines 50 and 52, the layout area of the field transistor on the chip can be equivalently reduced.

[Seventh Embodiment]

Figure 12:
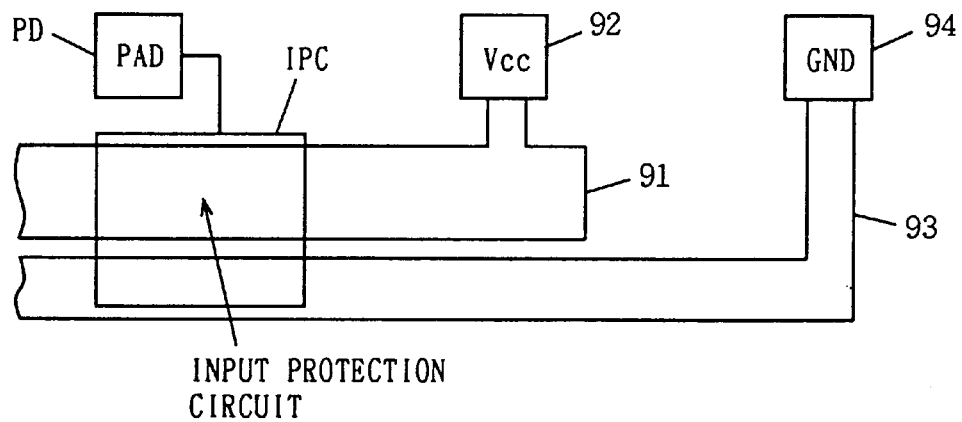
FIG. 12 is a schematic view of a structure of a main portion of a semiconductor integrated circuit device according to the seventh embodiment.

FIG. 12 schematically shows a structure of a main portion of a semiconductor integrated circuit device according to the seventh embodiment. Referring to FIG. 12, conductor lines 91 and 93 are placed in parallel with each other at a layer overlying input protection circuit IPC. Input protection circuit IPC may be covered completely or partially. Input protection circuit IPC is electrically connected to pad PD. Conductor line 91 is connected to power supply pad 92 receiving supply voltage Vcc, and conductor line 93 is electrically connected to ground pad 94 receiving ground voltage GND.

Pads PD, 92 and 94 are placed aligned with each other. Pads PD, 92 and 94 may be arranged in "LOC structure" in which they are placed at a central portion of a semiconductor chip, or placed according to "peripheral pad" arrangement in which they are placed along the periphery of the semiconductor chip.

As shown in FIG. 12, power supply line 91 and ground line 93 respectively from power supply pad 92 and ground pad 94 can be arranged to extend over a region for formation of the input protection circuit, by electrically connecting conductor lines 91 and 93 respectively to power supply pad 92 and ground pad 94. Accordingly, an area for the layout of power supply line 91 and ground line 93 can be reduced effectively.

Power supply pad 92 and ground pad 94 may be arranged to be opposite to each other in relation to pad PD in the pad arrangement shown in FIG. 12.

According to the seventh embodiment, since the power supply line and the ground line respectively connected to the supply pad and the ground pad are placed to extend over the input protection circuit, an easier layout of the power supply line and ground line as well as reduction of the layout area are achieved. Further, an additional conductor line for absorbing the heat from the input protection circuit is unnecessary, so that the heat from the input protection circuit can be cooled easily without increasing the number of the manufacturing processes and without increasing the area for layout of the interconnection lines.

[Eighth Embodiment]

Figure 13:
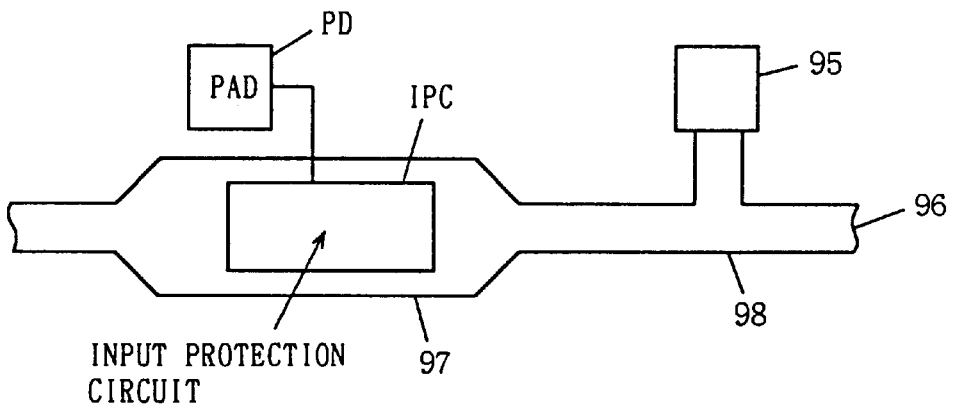
FIG. 13 is a schematic view of a structure of a main portion of a semiconductor integrated circuit device according to the eighth embodiment.
Figure 14:
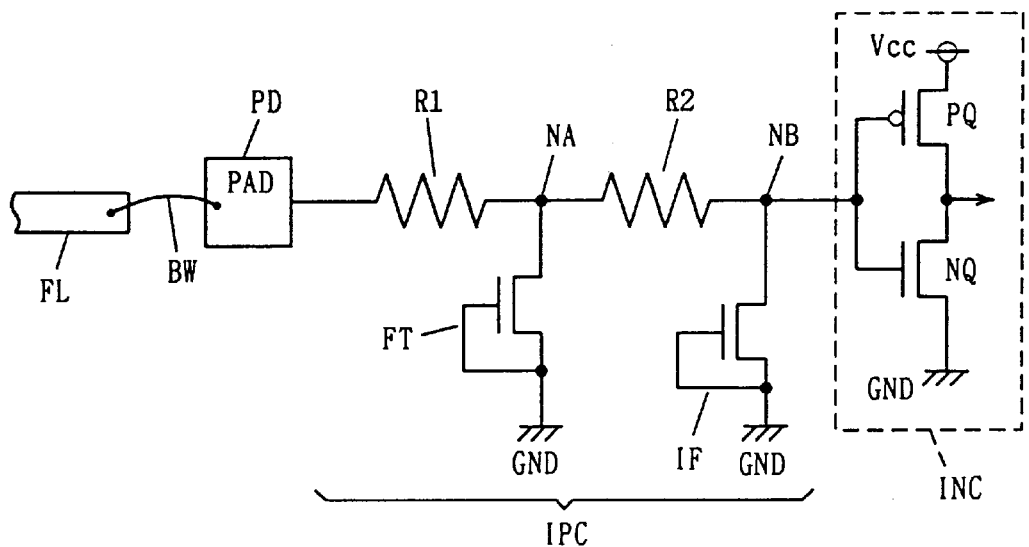
FIG. 14 schematically shows a structure of a conventional input protection circuit.
Figure 15:
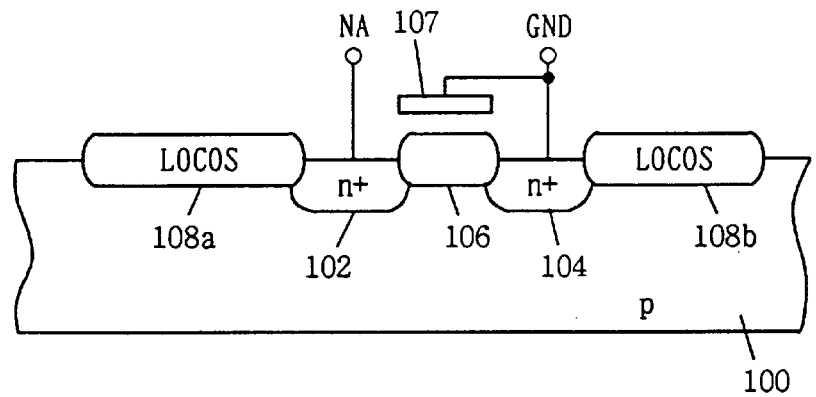
FIG. 15 is a schematic cross sectional structure of the field transistor shown in FIG. 14.
Figure 16:
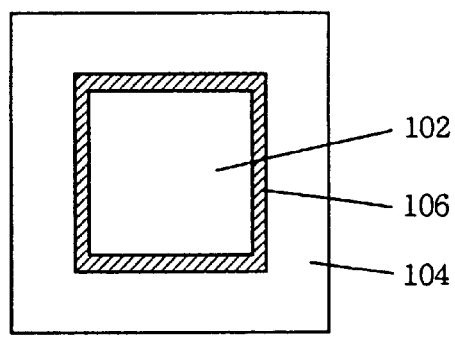
FIG. 16 is a schematic plan view of a layout of the field transistor in FIG. 14.

FIG. 13 schematically shows a structure of a main portion of a semiconductor integrated circuit device according to the eighth embodiment. In the arrangement shown in FIG. 13, a conductor line 96 connected to a pad 95 is placed extending at a layer overlying input protection circuit IPC. Conductor line 96 includes a cover portion 97 having an increased width at an upper portion overlying input protection circuit IPC and a portion 98 having a normal width, for transmitting a prescribed voltage to other circuits at a region different from the region input protection circuit IPC.

According to the arrangement shown in FIG. 13, a portion 97 having an increased width is provided on one conductor line 96 at a layer portion overlying input protection circuit IPC. By providing large width portion 97, a conductor line can be placed to cover at least a part of input protection circuit IPC at a layer overlying input protection circuit IPC easily even if only conductor line 96 is placed at a portion adjacent to input protection circuit IPC. Accordingly, a layer capable of absorbing the heat from input protection circuit IPC can be placed easily without increasing complexity of the interconnection layout.

In the arrangement in which pads 92, 94 and 95 are provided adjacent to input protection circuit IPC as shown in FIGS. 12 and 13, the heat from input protection circuit IPC can be transmitted to the pad portions 92, 94 and 95 for diffusing the heat from the pad portions, and the heat from input protection circuit IPC can be discharged efficiently.

Although two conductor lines are placed in parallel with each other at a layer overlying input protection circuit IPC according to the first to the seventh embodiments, the two conductor lines placed in parallel with each other may not be a power supply line and a ground line respectively transmitting voltages not equal to each other, but conductor lines transmitting the identical voltage. Specifically, even if only the power supply lines or the ground lines are placed in parallel with each other and these lines supply voltage to separate circuit portions (e.g. data input/output portion and control signal input portion), a similar effect can be obtained so long as an interconnection line is provided to cover at least a part of the input protection circuit IPC at a layer overlying input protection circuit IPC.

According to this embodiment, an input protection circuit is arranged below a metal interconnection line having a sufficient width. As a result, the heat from the input protection circuit can always be dissipated by the upper layer metal interconnection line. Further, the metal interconnection line and the input protection circuit are arranged such that they overlap with each other in the plan view, providing an effective reduction of an area for layout of the protection circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a pad electrically connected to an external terminal;
   a protection circuit coupled to said pad through a conductive interconnection line, for absorbing a high voltage having an absolute value of at least a prescribed value applied to said pad; and
   a conductor line formed covering at least a part of said protection circuit at a layer overlying said protection circuit, said conductor line arranged extending across said at least a part of said protection circuit and separated from said conductive interconnection line.

2. The semiconductor integrated circuit device according to claim 1, wherein said protection circuit includes:
   a resistance element having an end coupled to said pad; and
   a high voltage conduction element coupled to another end of said resistance element, rendered conductive when the absolute value of the voltage applied via said resistance element attains to at least the prescribed level for connecting the other end of said resistance element to a reference voltage source supplying a voltage of a prescribed voltage level, and wherein
   said conductor line is arranged to cover at least a part of said high voltage conduction element.

3. The semiconductor integrated circuit device according to claim 2, wherein
   said conductor line is arranged to cover both of said resistance element and said high voltage conduction element.

4. The semiconductor integrated circuit device according to claim 2, wherein
   said conductor line is arranged to partially cover said resistance element and entirely cover said high voltage conduction element.

5. The semiconductor integrated circuit device according to claim 2, wherein
   said conductor line includes:
   a first interconnection conductor arranged to partially cover said resistance element and entirely cover said high voltage conduction element; and
   a second interconnection conductor arranged in parallel with said first interconnection conductor and with a gap therebetween, and arranged to cover at least a part of a remaining portion of said resistance element.

6. The semiconductor integrated circuit device according to claim 2, wherein
   said conductor line includes
   a first interconnection conductor arranged to cover said high voltage conduction element; and
   a second interconnection conductor arranged in parallel with said first interconnection conductor and with a gap therebetween and arranged to cover a part of said resistance element.

7. The semiconductor integrated circuit device according to claim 2, wherein
   said conductor line includes:
   a first interconnection conductor line arranged to cover a portion of said high voltage conduction element; and
   a second interconnection conductor line formed in parallel with said first interconnection conductor and with a gap therebetween, and arranged to cover at least a part of a remaining portion of said high voltage conduction element.

8. The semiconductor integrated circuit device according to claim 2, wherein said conductor line includes a first interconnection conductor formed above said high voltage conduction element to cover a part of said high voltage conduction element, and a second interconnection conductor formed in parallel with said first interconnection conductor and with a gap between to cover a remaining portion of said high voltage conduction element, said resistance element being uncovered by the first and second interconnection conductors.

9. The semiconductor integrated circuit device according to claim 8, wherein said high voltage conduction element includes an impurity region coupled through a contact hole to said resistance element, and wherein said gap is made wider above a portion where said contact hole is formed.

10. The semiconductor integrated circuit device according to claim 1, wherein
    said conductor line is a metal interconnection line having a good heat transfer characteristic.

11. The semiconductor integrated circuit device according to claim 10, wherein
    said metal interconnection line is an aluminum interconnection line.

12. The semiconductor integrated circuit device according to claim 1, wherein
    said conductor line is a power supply line for transmitting a power supply voltage.

13. The semiconductor integrated circuit device according to claim 1, wherein
    said conductor line is a ground line for transmitting a ground voltage.

14. The semiconductor integrated circuit device according to claim 1, wherein
    said semiconductor integrated circuit device includes a plurality of conductor interconnection lines formed of the same material and formed at different layers, and
    said conductor line is a conductor interconnection line formed at an uppermost layer of said plurality of conductor interconnection lines.

15. The semiconductor integrated circuit device according to claim 1, wherein
    said pad is an input pad receiving an external signal.

16. The semiconductor integrated circuit device according to claim 1, wherein
    said pad is an input/output pad for input and output of a signal.

17. The semiconductor integrated circuit device according to claim 1, wherein
    said conductor line has a covering portion formed above said high voltage conduction element and having a first width, and a normal portion connected to said covering portion and having a second width narrower than said first width.

18. The semiconductor integrated circuit device according to claim 1, wherein said conductor line includes a power supply line transmitting a power supply voltage, and a ground line formed in parallel with said power supply line and transmitting a ground voltage.

19. The semiconductor integrated circuit device according to claim 1, further comprising a data input/output circuit coupled to said pad for communicating data with said pad and arranged opposing to said protection circuit relative to said pad.

20. A semiconductor integrated circuit device comprising:

a pad electrically connected to an external terminal;

a protection circuit coupled to said pad, for absorbing a high voltage having an absolute value of at least a prescribed value applied to said pad: and a conductor line formed covering at least a part of said protection circuit at a layer overlying said protection circuit, wherein said protection circuit includes:

a resistance element having an end coupled to said pad; and a high voltage conduction element coupled to another end of said resistance element, rendered conductive when the absolute value of the voltage applied via said resistance element attains at least the prescribed level for connecting the other end of said resistance element to a reference voltage source supplying a voltage of a prescribed voltage level, and wherein said conductor line is arranged to cover at least a part of said high voltage conduction element, wherein said resistance element and said high voltage conduction element are arranged in a L-shape form.

* * * * *

UNITED STATES PATENT AND TRADEMARK OFFICE
CERTIFICATE OF CORRECTION

PATENT NO.   : 5,909,046
DATED        : June 1, 1999
INVENTOR(S)  : Tetsushi TANIZAKI, et al It is certified that error appears in the above-identified patent and that said Letters Patent is hereby corrected as shown below:

Column 18, Claim 8, Line 7, change "between" to -- therebetween--; and

Column 18, Claim 17, Line 2, change "claim 1" to --claim 2--.

Signed and Sealed this

Twenty-ninth Day of February, 2000

Attest:

Q. TODD DICKINSON

Attesting Officer

Commissioner of Patents and Trademarks